United States Patent
Grichener et al.

(10) Patent No.: US 11,444,610 B1
(45) Date of Patent: Sep. 13, 2022

(54) VARIABLE FREQUENCY MULTIPLIER

(71) Applicant: Keysight Technologies, Inc., Santa Rosa, CA (US)

(72) Inventors: Alex Grichener, Plymouth, MN (US); Naveed Edalati, Santa Rosa, CA (US); Leonard M. Weber, Bodega Bay, CA (US); Xiaohui Qin, Santa Rosa, CA (US); Ryan Michael Avella, Santa Rosa, CA (US); David Massie, Santa Rosa, CA (US); Stuart Horsburgh, Windsor, CA (US); Cameron Blatter, Santa Rosa, CA (US); Nicholas Brennan, Petaluma, CA (US); Michael John Harriman, Santa Rosa, CA (US); Andy Ferrara, Santa Rosa, CA (US); Harrison Statham, Santa Rosa, CA (US); Scott A. Hovland, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 32 days.

(21) Appl. No.: 17/085,958

(22) Filed: Oct. 30, 2020

Related U.S. Application Data

(60) Provisional application No. 62/951,759, filed on Dec. 20, 2019.

(51) Int. Cl.
*H03K 5/00* (2006.01)
*H03F 3/19* (2006.01)
*H03G 5/16* (2006.01)

(52) U.S. Cl.
CPC .......... *H03K 5/00006* (2013.01); *H03F 3/19* (2013.01); *H03G 5/165* (2013.01); *H03F 2200/165* (2013.01); *H03F 2200/171* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 8,704,562 B2 | 4/2014 | Nicholls et al. | |
| 8,744,004 B2 | 6/2014 | London et al. | |
| 8,878,575 B1 * | 11/2014 | Blumke | H03B 19/03 327/119 |
| 10,345,836 B1 * | 7/2019 | Ware | G05F 1/567 |
| 2011/0304318 A1 | 12/2011 | Noujeim et al. | |
| 2019/0181832 A1 * | 6/2019 | Schmalzl | H03H 9/02007 |

* cited by examiner

Primary Examiner — Daniel C Puentes

(57) ABSTRACT

A variable frequency multiplier circuit for frequency multiplying an input signal provided by an ultra-low phase noise signal source includes a tone generator configured to generate a multiple tones from the input signal; a signal separating circuit configured to separate the multiple tones into tones of interest and idler tones, where the tones of interest are separated into one or more groups and outputted from the signal separating circuit, and the idler tones are terminated; an amplification circuit configured to amplify each group of the tones of interest to optimize small and large signal responses; and a switched filter bank configured to selectively connect a selected tone from the tones of interest to a circuit output.

19 Claims, 4 Drawing Sheets

VARIABLE FREQUENCY MULTIPLIER

CROSS-REFERENCE TO RELATED APPLICATION

The present application claims priority under 35 U.S.C. § 119(e) to U.S. Provisional Application No. 62/951,759 filed on Dec. 20, 2019. The entire disclosure of U.S. Provisional Application No. 62/951,759 is specifically incorporated herein by reference in its entirety.

BACKGROUND

Signal generators are used for various purposes in electronics, particularly in the field of radio frequency (RF) communications. For example, signal generators are used to provide local oscillator (LO) signals, which may be mixed with RF signals enabling frequency upconversion or downconvertion. Signal generators may also be used to provide high frequency clocks. Signal generators may also contain subsystems that generate multiple fixed frequency tones spaced over a predetermined bandwidth (multi-tone signals).

It is desirable for multi-tone signals to have low phase noise, which is a commonly used measure of frequency stability. Generally, reducing the phase noise increases frequency stability. Current solutions for generating multi-tone signals having low phase noise include banks of several multipliers and accompanying circuitry. The accompanying circuitry is substantial, including for example frequency doublers, frequency triplers, mixers, harmonic filters and amplifiers, all of which are expensive, physically large and power consumptive.

There have been attempts to replace the banks of multipliers using step recovery diodes (SRDs) or non-linear transmission lines (NLTLs), which are capable of generating combs of frequencies that can be selected as desired. The SRDs and NLTLs allow for more compact designs and smaller size than the banks of multipliers. However, SRDs can significantly degrade phase noise, and NLTLs can degrade the system noise figure due to poor conversion efficiency. Further, NLTLs are inherently difficult to match with components to which they are connected. Failure to present good output matches to NLTLs may result in unpredictable output tone levels. Indeed, experimentation shows that output power at harmonic frequencies provided by an NLTL may degrade by up to 10 dB, which prevents selection of desired tones using a conventional switched filter bank. That is, power of desired tones may be compromised when reflected tones re-multiply and/or mix in the NLTL, and then proceed to re-combine destructively with the desired tones. Also, conventional filters are reflective out-of-band, which means that they present a poor match at frequencies that the filters do not pass. Thus, the undesired tones are rejected, but not terminated, and therefore may be reflected back into the device preceding the filter (e.g., the NLTL).

Higher order effects, such as intermodulation products folding back on top of fundamental tones, are also considered. Noise from the fold back terms adds with the desired tones, which can degrade phase noise. The fold back terms can also change the phase and amplitude of the desired tones (a process sometimes referred to as "phase pulling"). These phase/amplitude shifts can change with temperature and therefore limit the temperature range over which the system can maintain good performance. Still another adverse effect of the fold back terms is gain compression of the amplifier resulting in potential degradation of system noise figure At a macroscopic level, frequency upconverters and downconverters and frequency synthesizers that may be used with signal generators in small form factors, such as PCI eXtensions for Instrumentation (PXI) and PXI express (PXIe) chassis and conversion/transceiver heads, necessarily have limitation in size and DC power. A frequency upconverter, for example, may be split into separate modules including an intermediate frequency (IF) section, an LO section, and an RF section, for example. Similarly, a frequency synthesizer that requires a high frequency reference clock may implement clock multiplication circuitry separately. Designs that attempt to make integrated assemblies using traditional components and techniques have effectively reached the limits of such small form factors.

Thus, a frequency multiplier circuit is needed that is capable of generating multiple, selectable tones, and that is extremely compact, ultra-low noise, relatively inexpensive, and requires little DC power. Also, a filtering technique is needed that rejects undesired tones, but does not reflect them back into the NLTL, which could otherwise cause cancelation with desired tones.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
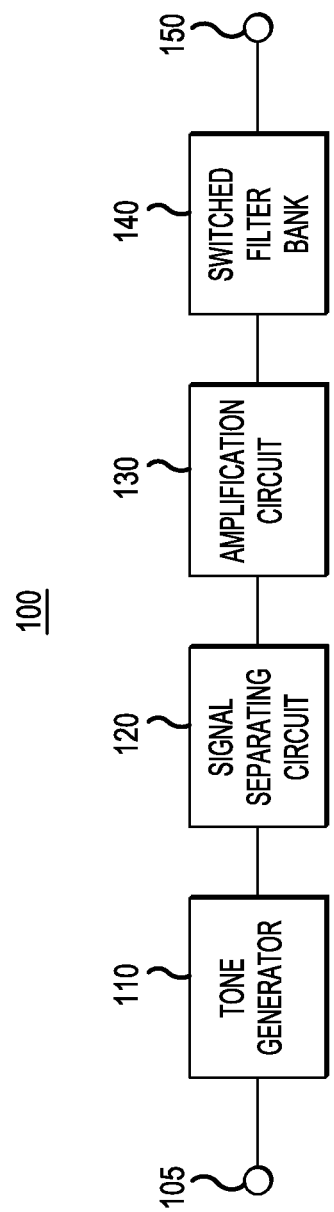
FIG. 1 is a simplified block diagram of a variable frequency multiplier circuit for frequency multiplying an input signal, according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a," "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a signal measurement device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

According to various embodiments, a variable frequency multiplier circuit may use an NLTL to generate a comb of frequency tones. The various embodiments utilize a signal separating circuit, such as a multiplexer or a reflectionless band pass filter, at the output of the NLTL to separate the tones provided by NLTL into tones of interest and undesired idler tones by passing the tones of interest (which are grouped into respective bandwidths) and properly terminating the undesired tones to a matched load. The tones of interest are provided to a switched filer bank, enabling selection of a desired tone of the tones of interest for output.

Poor conversion efficiency of the NLTL directly affects the system noise figure of the variable frequency multiplier. Thus, instead of placing the tone selecting switched filter bank immediately after the signal separating circuit, the various embodiments include amplifiers directly at the output of the signal separating circuit. This enables substantially immediate amplification of the tones of interest, which helps to maintain a good signal to noise ratio (SNR).

FIG. 1 is a simplified block diagram of a variable (xN) frequency multiplier circuit for frequency multiplying an input signal, according to a representative embodiment. The variable multiplier is able to perform ideal multiplication (20 log N) with an insignificant amount of additive phase noise.

Referring FIG. 1, variable frequency multiplier circuit 100 includes a tone generator 110, a signal separating circuit 120, an amplification circuit 130 and a switched filter bank 140. The tone generator 110 is configured to receive an input signal at a circuit input 105 from an ultra-low phase noise signal source or reference (not shown) and to generate multiple tones at corresponding tone frequencies from the input signal. An ultra-low phase noise signal source means that the RF signal generated by the signal source has minimal phase noise with respect to a particular application where phase noise is a critical specification, as would be apparent to one of ordinary skill in the art.

The tone generator 110 is configured to receive the input signal from the ultra-low phase noise signal source, and to generate multiple tones from the input signal. For example, the tone generator 110 may create a comb of tones at harmonic frequencies of the carrier frequency (A) of the input signal. The tone generator 110 may be a non-linear transmission line (NLTL), for example, for generating the multiple tones, although other types of suitable tone generators may be incorporated without departing from the scope of the present teachings. Notably, NLTLs generally have superior phase noise characteristics as compared to other tone generators. Residual phase noise performance ranging from −170 dBc to −190 dBc can be achieved using NLTLs, while additive phase noise depends on the semiconductor process and the biasing scheme of the NLTL (e.g., a self-biasing topology). NLTLs also generally provide excellent amplitude and phase stability over temperature.

The signal separating circuit 120 is configured to separate the multiple tones output by the tone generator 110 into tones of interest and idler tones. The tones of interest are tones at desired frequencies that ultimately may be selected and output by the variable frequency multiplier circuit 100 at a circuit output 150. The idler tones are tones at unwanted frequencies, which are rejected and not available at the circuit output 150. The tones of interest are output by the signal separating circuit 120 to the amplification circuit 130, and the idler tones are terminated to one or more matched loads (e.g., 50 ohm termination), to prevent them from reflecting back to the tone generator 110 and/or the signal separating circuit 120, which would distort or otherwise interfere with the tones of interest.

The signal separating circuit 120 separates the tones of interest into one or more groups within corresponding discrete bandwidths. For example, when there are three tones of interest, all three tones may be output by the signal separating circuit 120 within one bandwidth, e.g., defined by the passband of a band pass filter; each tone of interest may be output within its own corresponding bandwidth; or two of the tones of interest may be output within one bandwidth while the other tone of interest may be output within a separate bandwidth. The purpose of grouping the tones of interest within bandwidth(s) is to prevent over compressing the amplifiers in the amplification circuit 130, and to minimize higher order effects. Generally, there is a practical limit on the number of tones of interest that may be presented to a single amplifier, beyond which the amplifier has lower gain and significant intermodulation distortion.

The amplification circuit 130 is configured to amplify each group of the tones of interest output by the signal separating circuit 120, optimizing small and large signal responses. The amplification circuit 130 includes one or more amplifiers, where at least one amplifier is provided to amplify each group of the tones of interest output by the signal separating circuit 120. So, building on the example above, when all three tones of interest are in one group, the amplification circuit 130 includes one amplifier for that group; when the three tones of interest are in three corresponding groups, the amplification circuit 130 includes three amplifiers for the three groups, respectively; and when two of the tones of interest are in one group and one of the tones of interest is in another group, the amplification circuit 130 includes two amplifiers for the two groups, respectively. The one or more amplifiers of the amplification circuit 130 may be low noise amplifiers (LNAs), for example, although other types of amplifiers with a large dynamic range and exceptional noise figure may be included, without departing from the scope of the present teachings.

Generally, with regard to grouping the tones of interest within a bandwidth and amplifying each group, a single group including all of the tones of interest would result in the most compact implementation of the variable frequency multiplier circuit 100 because only one amplifier would be required in the amplification circuit 130 to amplify the tones of interest. However, the one amplifier would need to have sufficient dynamic range to add as little noise and distortion as possible to the amplified tones of interest output from the amplification circuit 130. A larger and more complex implementation of the variable frequency multiplier circuit 100, with less demanding amplifier requirements, includes three amplifiers in the amplification circuit 130. In this case, the three tones of interest would be individually filtered by the signal separating circuit 120 (e.g., a multiplexer or reflection-less filter) and coupled to a corresponding one of the three amplifiers (i.e., one amplifier for each tone of interest).

Notably, though, individually filtering and amplifying each tone of interest may become impractical as the total number of tones of interest becomes larger (e.g., increasing to much higher than three). This is due to size and DC-power constraints, as well as high-channel count multiplexer design challenges. On the other hand, it may also become impractical to amplify a large number of tones with a single amplifier since non-linear effects may compromise SNR and temperature stability of the amplified tones of interest. Generally, based on simulations using realizable component models, as well as empirical findings, it has been determined that a good operation point of the variable frequency multiplier circuit 100 is a group of three or four tones of interest per amplifier in the amplification circuit 130. However, the number of tones of interest in each group input to a single amplifier may vary to provide unique benefits for any particular situation or to meet application specific design requirements of various implementations, depending on factors such as frequency range and tone spacing of the tones of interest in the group, for example.

In an embodiment, the amplification circuit 130 may also include one or more equalizers respectively corresponding to the one or more amplifiers. Each of the equalizers would be positioned between the signal separating circuit 120 and a corresponding amplifier, and is configured to condition the tones of interest to compensate for the gain slope of the corresponding amplifier. The equalizers set power levels to avoid over-compressing each of the amplifiers in the amplification circuit 130 and to keep intermodulation distortion among the tones of interest to acceptable levels.

The switched filter bank 140 is configured to receive the amplified tones of interest from the amplification circuit 130, and to selectively connect a selected one of the tones of interest to the circuit output 150. The switched filter bank 140 may be a switched band pass filter (BPF), for example, although low and high pass switched filters may be incorporated without departing from the scope of the present teachings. The switching performed by the switched filter bank 140 is controlled in response to a selection signal provide by a controller (not shown). The controller provides the selection signal in response to an input by a user or determines the selection signal automatically.

The controller may include one or more processor devices and memory. The one or more processing devices may include, for example, field programmable gate arrays (FPGAs), application specific integrated circuits (ASICs), microprocessors, computer processors, or combinations thereof, using any combination of hardware, software, firmware, hard-wired logic circuits, or combinations thereof. The memory may be implemented by any number, type and combination of random access memory (RAM) and read-only memory (ROM), for example, and may store various types of information, such as software algorithms and computer programs executable by the one or more processing devices. The various types of ROM and RAM may include any number, type and combination of computer readable storage media, such as a disk drive, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art, which are tangible and non-transitory storage media (e.g., as compared to transitory propagating signals). The memory may store software instructions and/or computer readable code that enables performance of various functions, including the switching functions.

The controller may further include a user interface for providing information and data to the user and/or for receiving information and data from the user. That is, the user interface enables the user to enter data and to control or manipulate the switching functions of the variable frequency multiplier circuit 100, and also enables the controller to indicate the current state of the switching, evadible tone frequencies, and the like. The user interface may provide information and data to the user via a display, which may include a graphical user interface. The user interface may receive information and data from the user via one or more of a keyboard, a mouse, a trackball, a joystick, a touchpad, and a touch screen, for example.

Figure 2:
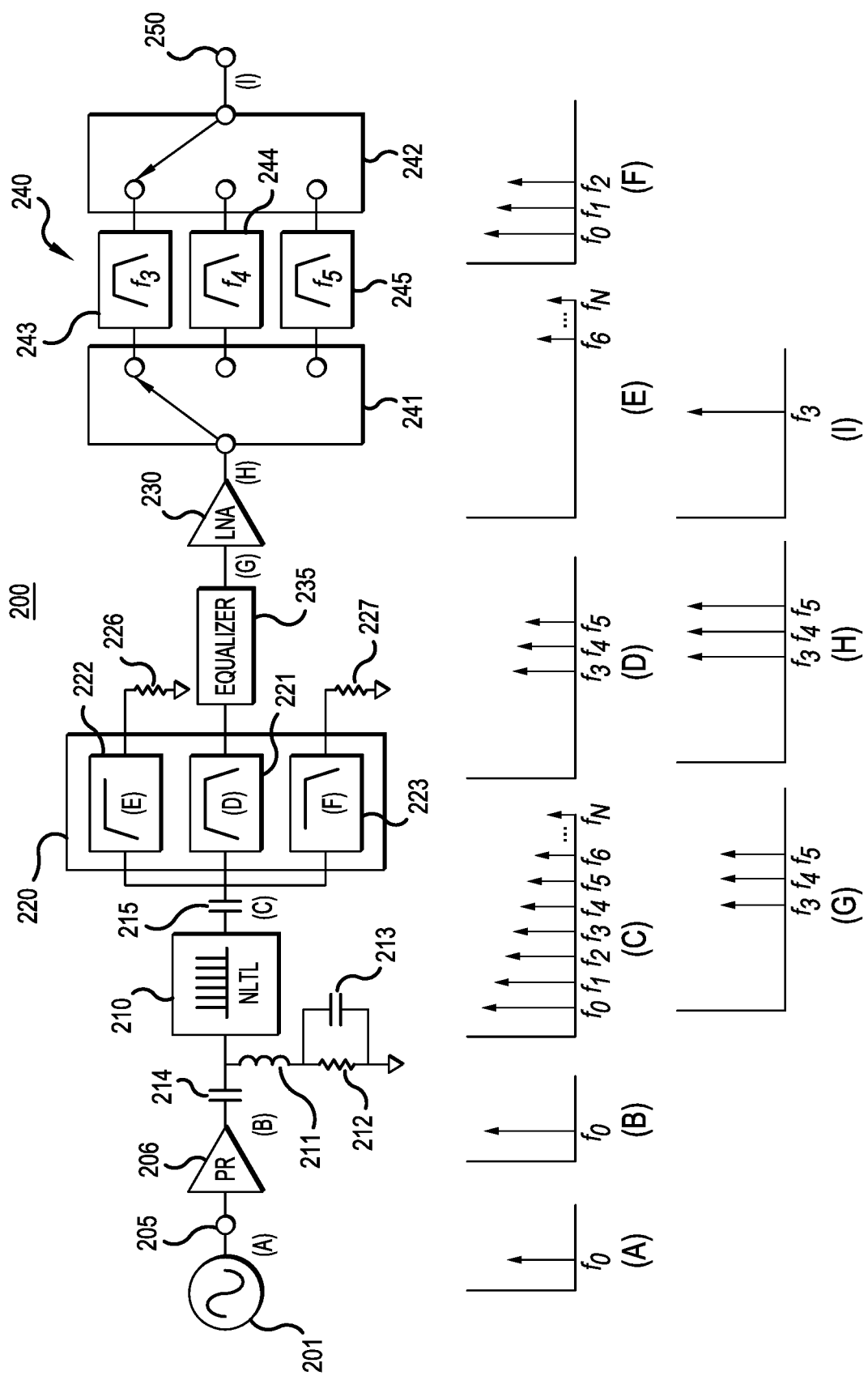
FIG. 2 is a simplified block diagram of a variable frequency multiplier circuit for frequency multiplying an input signal, according to a representative embodiment.

FIG. 2 is a simplified block diagram of a variable frequency multiplier circuit for frequency multiplying an input signal, according to a representative embodiment. The variable frequency multiplier circuit of FIG. 2 is shown in more detail than that shown in FIG. 1, and is otherwise directed to a particular implementation for purposes of illustration. FIG. 2 includes graphs (A) through (I), which show signals at correspondingly marked locations in the variable frequency multiplier circuit.

Referring FIG. 2, variable frequency multiplier circuit 200 receives an input signal at a circuit input 205 from an ultra-low phase noise signal source 201. The input signal may be an RF signal, for example, having a carrier frequency $f_0$, as shown in graph (A). Generally, the variable frequency multiplier circuit 200 multiplies the input signal by multiplication of the carrier frequency $f_0$ to multiple harmonic frequencies, and selectively outputs an output signal at one of the harmonic frequencies at a circuit output 250.

The input signal is provided to a power amplifier (PA) 206 for amplification, indicated by the increased magnitude of the carrier frequency $f_0$ as shown in graph (B). The amplified signal is provided to NLTL 210, which is configured to generate multiple tones at corresponding harmonic frequencies of the carrier frequency $f_0$ as shown in graph (C). For purposes of illustration, the NLTL 210 generates N tones at frequencies $f_1$, $f_2$, $f_3$, $f^4$, $f_5$, $f_6$, $f_N$, which are the first through $N^{th}$ harmonics of the carrier frequency $f_0$ of the input signal, respectively. In an embodiment, N represents infinite harmonics, although the number of tones generated by the NLTL 210 may be set to a specific number N, without departing from the scope of the present teachings.

The power amplifier 206 drives NLTL 210 and is configured to operate in compression in order to optimize the conversion efficiency of the NLTL 210, which in effect preserves the system noise figure of the variable frequency multiplier circuit 200. Generally, the NLTL 210 may handle drive levels upwards of 20 dBm. The power amplifier 206 is also driven into compression in order to limit amplitude modulation (AM) to phase modulation (PM) conversion of the power amplifier 206, which may otherwise degrade phase noise in the multiplication process. To preserve close-in phase noise of the variable frequency multiplier circuit 200, the power amplifier 206 is provided to have exceptional flicker noise characteristics (1/f noise), or minimal 1/f noise.

In the depicted embodiment, the variable frequency multiplier circuit 200 also includes DC blocking capacitors 214 and 215 at the input and output of the NLTL 210, respectively. Optionally, the variable frequency multiplier circuit 200 may include a broadband RF choke to ground, indicated by inductance 211, at the input of the NLTL 210 in order to reduce DC voltage noise, and limit phase noise degradation during multiplication. The broadband RF choke to ground mitigates mismatches at the input of the NLTL 210. Further optionally, a resistor 212 is connected to ground to properly bias the NLTL 210. That is, the resistor 212 is used to mimic the equivalent video resistance of diodes in the NLTL 210, allowing for the diodes to be properly self-biased thereby optimizing the efficiency of the NLTL 210 with no compromise to its additive phase noise. A capacitor 213 may be connected in parallel across the resistor 212 to filter noise.

The tones output by the NLTL 210 are input to a multiplexer 220, which includes multiple filters used to pass certain desired tones (the tones of interest) and to terminate the remaining tones (the idler tones) to a matched load. In the illustrative embodiment, the multiplexer 220 includes a band pass filter 221, a high pass filter 222 and a low pass filter 223. The band pass filter 221 passes the tones of interest, which in the depicted example are the three tones at the third, fourth and fifth harmonic frequencies $f_3$, $f_4$ and $f_5$, as shown in graph D. The multiplexer 220 is configured to separate the tones of interest into one or more groups within corresponding bandwidths (e.g., the passbands of the band pass filters). In the example, all three tones of interest ($f_3$, $f_4$, and $f_5$) are in one group, which is defined by the passband of the band pass filter 221. The tones of interest ($f_3$, $f_4$ and $f_5$) are output by the multiplexer 220. The multiplexer 220 presents a broadband match to the NLTL 210 in order to minimize reflections that cause harmonics to reenter the NLTL 210 and combine destructively with the tones of interest.

Meanwhile, the high pass filter 222 passes all the idler tones ($f_6$) having frequencies greater than the high pass cut-off frequency (unwanted higher frequency idler tones), which is necessarily greater than an upper passband frequency of the band pass filter 221, as shown in graph (E). The multiplexer 220 terminates the output of the high pass filter 222 to a matched load 226 (e.g., 50 ohms). The low pass filter 223 passes all the idler tones ($f_0$, $f_1$ and $f_2$) having frequencies less than the low pass cut-off frequency (unwanted lower frequency idler tones), which is necessarily less than a lower passband frequency of the band pass filter 221, as shown in graph (F). The multiplexer 220 terminates the output of the low pass filter 223 to a matched load 227 (e.g., 50 ohms). By terminating the idler tones, the multiplexer 220 presents a broadband match to the NLTL 210, minimizing reflections that could cause harmonics at unwanted frequencies ($f_1$, $f_2$ and $f_6$ . . . $f_N$) to reenter the variable frequency multiplier circuit 200 and combine destructively with the desired tones of interest ($f_3$, $f_4$ and $f_5$). For example, idler tones (which are very high power, such as $f_0$) that are not terminated would reflect back into the NLTL 210 and reduce efficiency of the NLTL 210, which would degrade the SNR of the variable frequency multiplier circuit 200 overall.

The tones of interest ($f_3$, $f_4$ and $f_5$) are input to the equalizer 235 and the low noise amplifier (LNA) 230. The equalizer 235 equalizes magnitudes of the tones of interest ($f_3$, $f_4$ and $f_5$), as shown in graph (G), which compensates for gain slope of the LNA 230. This assists in setting a constant power level at the circuit output 250. The LNA 230 amplifies the equalized tones of interest ($f_3$, $f_4$ and $f_5$), as shown in graph (H). The LNA 230 located close to the output of the multiplexer 220 helps compensate for the generally poor conversion efficiency of the NLTL 210, which helps to preserve SNR and maintain a good system noise figure of the variable frequency multiplier circuit 200.

In alternative configurations, one or more band path filters may be included in the multiplexer 220 in addition to the band pass filter 221. In this case, the tones of interest may be grouped differently, as discussed above. For example, with a total of three band pass filters having different passbands, each of the tones of interest ($f_3$, $f_4$ and $f_5$) may be passed by one of the band pass filters, in which case there would be three groups, requiring three LNAs. With a total of two band pass filters having different passbands, two of the tones of interest (($f_3$, $f_4$) or ($f_4$, $f_5$)) may be passed by one of the band pass filters, and one tone of interest ($f_5$ or $f_3$) may be passed by the other one of the band pass filters, in which case there would be two groups, requiring two LNAs. Both of these alternative configurations would require different switched filter matrices of a switched band pass filter (BPF) bank, discussed below, to connect the LNAs to the circuit output 250, as would be apparent to one of ordinary skill in the art. Also, as discussed above, each additional LNA increases the size and complexity of the variable frequency multiplier circuit 200 implementation. However, because the LNA 230 amplifies fewer tones of interest with the addition of LNA(s), the demands on the LNA 230 (and each of the additional LNA(s)) are less, such as smaller dynamic range.

LNA 230 outputs the amplified tones of interest ($f_3$, $f_4$ and $f_5$) to a switched BPF bank 240 of the variable frequency multiplier circuit 200. The switched BPF bank 240 is configured to select, by operation of internal switches, a selected tone of interest as the output signal to be connected to the circuit output 250. In the illustrative embodiment, the switched BPF bank 240 includes an input switch 241, a complementary output switch 242, and a bank of three band pass filters 243, 244 and 245 that are selectively connected between the LNA 230 and the circuit output 250 by operation of the input switch 241 and the output switch 242, respectively. Each of the band pass filters 243, 244 and 245 may be low loss to preserve SNR, and needs to provide adequate harmonic suppression to achieve system requirements. In the depicted example, the band pass filter 243 has a passband for passing the tone of interest at the third harmonic frequency ($f_3$), the band pass filter 244 has a passband for passing the tone of interest at the fourth harmonic frequency ($f_4$), and the band pass filter 245 has a passband for passing the tone of interest at the fifth harmonic frequency ($f_5$). Also, the input switch 241 and the output switch 242 are shown switched to the band pass filter 243, such that the switched BPF bank 240 is set to select the tone of interest at the third harmonic frequency ($f_3$), as shown in graph (I). Accordingly, the output signal outputted at the circuit output 250 is effectively the input signal frequency multiplied to the third harmonic frequency ($f_3$) of the carrier frequency ($f_0$).

Figure 3:
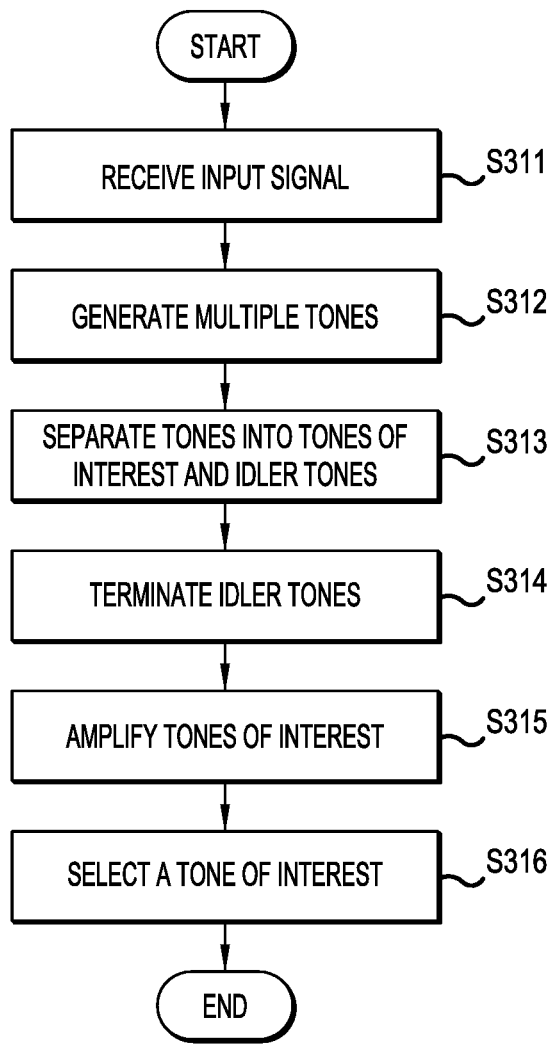
FIG. 3 is a simplified flow diagram of a method of frequency multiplying an input signal reference, according to a representative embodiment.

FIG. 3 is a simplified flow diagram of a method for frequency multiplying an input signal reference, according to a representative embodiment.

Referring to FIG. 3, an ultra-low phase noise RF input signal is received in block S311. The input signal has a signal tone at a carrier frequency. In block S312, multiple tones are generated from the received input signal, where the frequencies of the multiple tones are harmonics of the carrier frequency. The multiple tones may be generated by an NLTL, for example.

In block S313, the multiple tones are separated tones into tones of interest and idler tones. Each tone of the multiple tones is either a tone of interest or an idler tone after separation. For example, the tones may be filtered using one or more band pass filters, where each of the tones passing through the one or more band pass filters is a tone of interest. In addition, the tones of interests may be grouped according to the passbands of the band pass filters. That is, all of the tones that pass through any one band pass filter are in the same grouping. The tones are grouped in a manner that prevents over compression of amplifiers in subsequent stages and/or minimizes higher order effects. The tones may also be filtered using a low pass filter and a high pass filter to provide the idler tones. The low pass filter passes the idler tone(s) at frequencies lower than the lower passband frequency of the lowest frequency band pass filter, and the high pass filter passes the idler tone(s) at frequencies higher than the upper passband frequency of the highest frequency band pass filter.

In block S314, the idler tones are terminated. For example, the idler tone(s) output by the low pass filter may be terminated to a matched load, and the idler tone(s) output by the high pass filter may be terminated to another matched load. This prevents reflection of the idler tones, which may cause interference with the tones of interest being generated at block S312. The tones of interest are amplified in block S315. The tones of interest may be amplified by one or more LNAs, for example, following equalization of the tones of interest. When the tones of interest are grouped within one or more groups, as discussed above, each group of the tones of interest may be amplified by one corresponding LNA.

In block S316, one of the amplified tones of interest is selected as a selected tone of interest and outputted. The selected tone of interest may be selected using a switched filter bank, for example, that includes multiple band pass filters corresponding to the tones of interest, respectively. Therefore, the band pass filter corresponding to the selected tone of interest is connected to an output (selected) by operation of a switch. The select tone of interest is at a desired harmonic frequency of the carrier of the input signal.

Figure 4:
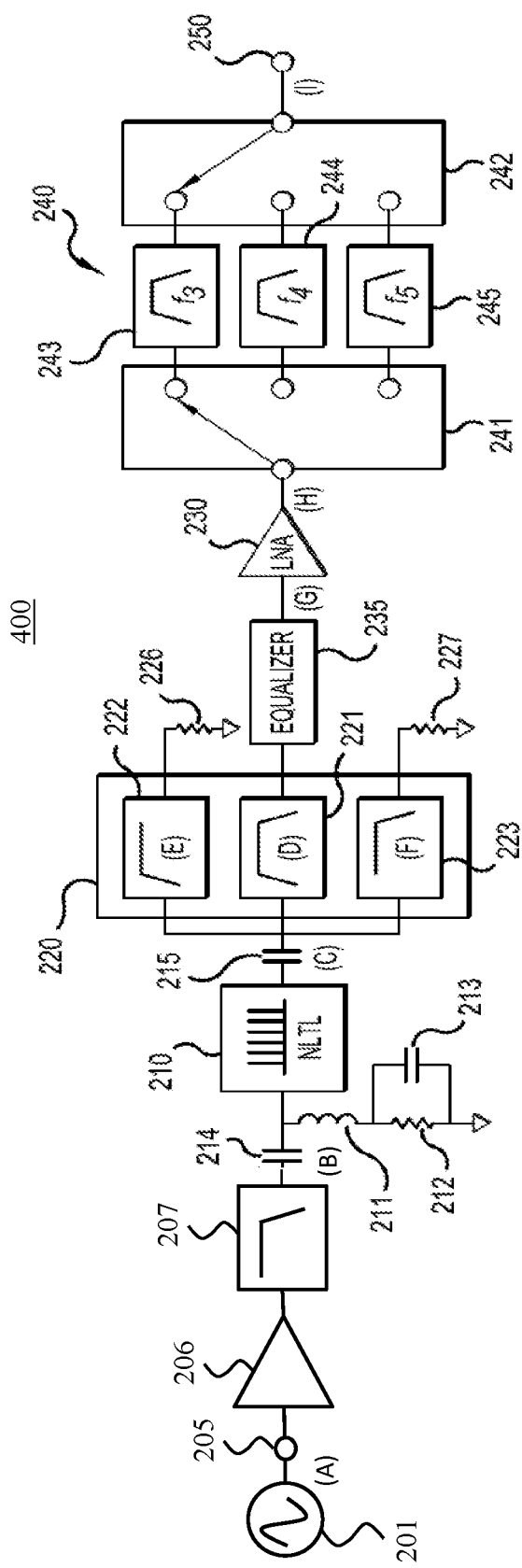
FIG. 4 is a simplified block diagram of a variable frequency multiplier circuit for frequency multiplying an input signal, according to another representative embodiment.

FIG. 4 is a simplified block diagram of a variable frequency multiplier circuit for frequency multiplying an input signal, according to another representative embodiment.

Referring to FIG. 4, variable frequency multiplier circuit 400 is substantially the same as the variable frequency multiplier circuit 200 in FIG. 2, with the addition of a low pass filter 207 connected between the power amplifier 206 and the DC blocking capacitor 214. Generally, the variable frequency multiplier circuit 400 receives an input signal with a carrier frequency $f_0$ at the circuit input 205 from the ultra-low phase noise signal source 201, multiplies the input signal by multiplication of a the frequency $f_0$ to multiple harmonic frequencies, and selectively outputs an output signal at one of the harmonic frequencies at the circuit output 250. The inclusion of the low pass filter 207, along with the DC blocking capacitor 214, prevents noise aliasing in the NLTL 210. The remaining components of the variable frequency multiplier circuit 400, as well as the referenced graphs (A) through (I), are substantially the same as shown in FIG. 2, and therefore the corresponding descriptions will not be repeated here.

Noise aliasing, similar to that found in sampling circuits, may be observed in NLTL based frequency multiplier subsystems, such as those in the variable frequency multiplier circuits 200 and 400. In particular, thermal noise at the output of the power amplifier 206 driving the NLTL 210 will be observed as sidebands at DC and at twice the input carrier frequency $f_0$ of the input signal. Flicker noise at the output of the power amplifier 206 resides at DC, as well as at the harmonics of the input signal when the power amplifier 206 operates in compression. The thermal noise and the flicker noise quantities may be considered as sidebands. In a conventional frequency multiplier circuit, these sidebands are rejected either by the balanced nature of the multiplier or by the bandpass filter(s) at the output. However, by design, the NLTL 210 generates a comb of harmonics with no even or odd order suppression. As a result, the noise sidebands are multiplied by the NLTL 210 and transferred to all of its harmonics. These noise sidebands may stack on top of one another. Although the sidebands generated by the power amplifier 206 experience considerable conversion loss during the multiplication process, the stacking effect of the noise sidebands may cause overall noise performance at each harmonic to degrade by about 2 dB to about 5 dB, as observed in simulations and measurements.

To prevent noise aliasing, the low pass filter 207 is positioned at the output of the power amplifier 206 and the input of the DC blocking capacitor 214. The low pass filter 207 removes noise at the harmonics of the input signal carrier frequency $f_0$ and the DC blocking capacitor 214 removes the near DC noise prior to the input of the NLTL 210. Equivalently, a bandpass filter may be incorporated in place of the low pass filter 207 and the DC blocking capacitor 214, although this configuration would introduce more loss.

The various embodiments provide a compact alternative to large and power consumptive switched multiplier circuits with no compromise in performance. For example, the variable frequency multiplier circuit may be used as an LO or a clock multiplication circuit that are extremely compact, ultra-low noise, relatively inexpensive, and require very low DC power. Additionally, the variable frequency multiplier provides more fixed tones to choose from than conventional switched multipliers. This allows for frequency planning that can yield frequency upconverters and frequency synthesizers with better phase noise and spurious performance characteristics. Also, the various embodiments allow for the use of NLTLs in ultra-low noise multi-tone fixed frequency generation, having significant improvement in noise performance over conventional NLTL based frequency multipliers. Thus, the frequency multiplier circuit simplifies the task of providing fully integrated frequency upconverter and frequency synthesizer modules with low phase noise in small form factors, for example.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A variable frequency multiplier circuit for frequency multiplying an input signal provided by an ultra-low phase noise signal source, the circuit comprising:
    a tone generator configured to generate a plurality of tones from the input signal;
    a signal separating circuit configured to separate the plurality of tones into a plurality of tones of interest and a plurality of idler tones, wherein the plurality of tones of interest are separated into one or more groups and outputted from the signal separating circuit, and the plurality of idler tones are terminated to a matched load;
    an amplification circuit configured to amplify each group of the plurality of tones of interest to optimize small and large signal responses; and
    a switched filter bank configured to selectively connect a selected tone from the plurality of tones of interest to a circuit output.

2. The circuit of claim 1, wherein the amplification circuit is further configured to provide equalization of the plurality of tones of interest to set constant power levels.

3. The circuit of claim 1, wherein optimizing small and large signal responses comprises avoiding over-compressing one or more amplifiers in the amplification circuit.

4. The circuit of claim 1, wherein the tone generator comprises a non-linear transmission line (NLTL).

5. The circuit of claim 4, wherein the signal separating circuit comprises a multiplexer having at least one band pass filter for separating the tones of interest from the idler tones.

6. The circuit of claim 4, wherein the signal separating circuit comprises a reflectionless band pass filter for separating the tones of interest from the idler tones.

7. A variable frequency multiplier circuit for frequency multiplying an input signal provided by an ultra-low phase noise signal source, the circuit comprising:
    a non-linear transmission line (NLTL) configured to receive the input signal and to generate a plurality of tones having frequencies corresponding to harmonics of a carrier frequency of the input signal, respectively;
    a multiplexer configured to filter the plurality of tones to provide a plurality of tones of interest;
    at least one low noise amplifier (LNA) configured to amplify the plurality of tones of interest; and
    a switched filter bank configured to selectively connect a selected tone from the plurality of amplified tones of interest to a circuit output, the selected tone having ultra-low phase noise,
    wherein the multiplexer comprises:
    at least one band pass filter configured to group one or more tones from the plurality of tones as the plurality of tones of interest;
    a low pass filter configured to provide at least one unwanted lower frequency idler tone of the plurality of tones, which is terminated to a matched load, the at least one unwanted lower frequency idler tone having a frequency less than a lower passband frequency of the at least one band pass filter; and
    a high pass filter configured to provide at least one unwanted higher frequency idler tone of the plurality of tones, which is terminated to another matched load, the at least one unwanted higher frequency idler tone having a frequency greater than an upper passband frequency of the at least one band pass filter.

8. The circuit of claim 7, wherein each tone of the plurality of tones filtered by the multiplexer is one of a tone of interest, an unwanted lower frequency idler tone, or an unwanted higher frequency idler tone.

9. The circuit of claim 7, wherein the multiplexer presents a broadband match to the NLTL in order to minimize reflections that cause harmonics to reenter the NLTL and combine destructively with the plurality of tones of interest.

10. The circuit of claim 7, wherein the switched filter bank comprises a plurality of band pass filters corresponding to the plurality of tones of interest, respectively.

11. The circuit of claim 10, wherein each of the band pass filters is low loss in order to preserve a signal to noise ratio (SNR) of the corresponding tone of interest and to provide sufficient harmonic rejection.

12. The circuit of claim 7, further comprising:
    a power amplifier with minimal 1/f noise configured to amplify the input signal, wherein the power amplifier operates in compression to optimize a conversion efficiency of the NLTL and to limit amplitude modulation to phase modulation conversion.

13. The circuit of claim 12, further comprising:
    a DC blocking capacitor and a radio frequency (RF) choke configured to reduce DC voltage noise; and
    a resistor to ground configured to properly bias the NLTL.

14. The circuit of claim 12, further comprising:
    a DC blocking capacitor at an input of the NLTL; and
    a low pass filter between the power amplifier and the DC blocking capacitor, wherein the low pass filter is configured to prevent noise aliasing in the NLTL.

15. The circuit of claim 7, further comprising:
    at least one equalizer configured to condition the plurality of tones of interest to compensate for a gain slope of each of the at least one LNA in order to set constant power levels at frequencies of the plurality of tones of interest.

16. The circuit of claim 15, wherein the constant power levels are set to avoid over-compressing each of the at least one LNA and to keep intermodulation distortion among the plurality of tones of interest to acceptable levels.

17. A method of frequency multiplying an input signal provided by an ultra-low phase noise signal source, the method comprising:
    receiving the input signal and generating a plurality of tones having frequencies corresponding to harmonics of a carrier frequency of the input signal, respectively;

separating the plurality of tones into a plurality of tones of interest and a plurality of idler tones;

separating the plurality of tones of interest into one or more groups;

terminating the plurality of idler tones to matched loads;

amplifying the one or more groups of the plurality of tones of interest; and selectively connecting a selected tone from the plurality of tones of interest of the amplified one or more groups to an output.

18. The method of claim 17, wherein the plurality of tones are generated by a non-linear transmission line (NLTL).

19. The method of claim 18, wherein separating the plurality of tones into the plurality of tones of interest and the plurality of idler tones comprises:

band pass filtering the plurality of tones to provide the plurality of tones of interest; and low and high pass filter the plurality of tones to provide the plurality of idler tones.

* * * * *